United States Patent
Tanaka et al.

(10) Patent No.: US 7,638,443 B2
(45) Date of Patent: Dec. 29, 2009

(54) METHOD OF FORMING ULTRA-THIN SIN FILM BY PLASMA CVD

(75) Inventors: Rei Tanaka, Tama (JP); Taku Hitomi, Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 11/940,253

(22) Filed: Nov. 14, 2007

(65) Prior Publication Data

US 2008/0113521 A1 May 15, 2008

Related U.S. Application Data

(60) Provisional application No. 60/865,784, filed on Nov. 14, 2006.

(51) Int. Cl.
*H01L 21/31* (2006.01)
*H01L 21/469* (2006.01)

(52) U.S. Cl. .................... 438/791; 257/E21.293

(58) Field of Classification Search ............... 438/795; 257/E21.293

See application file for complete search history.

(56) References Cited

U.S. PATENT DOCUMENTS

| | | | |
|---|---|---|---|
| 6,642,132 B2 | 11/2003 | Cho et al. | |
| 6,768,179 B2 | 7/2004 | Cho et al. | |
| 2001/0052618 A1 | 12/2001 | Hasegawa | |
| 2006/0110937 A1* | 5/2006 | Gates et al. | 438/778 |
| 2007/0123044 A1* | 5/2007 | Hohage et al. | 438/687 |

FOREIGN PATENT DOCUMENTS

| | | |
|---|---|---|
| JP | 2002-009169 | 1/2002 |
| JP | 2003-188276 | 7/2003 |
| JP | 2003-258257 | 9/2003 |

* cited by examiner

*Primary Examiner*—W. David Coleman
(74) *Attorney, Agent, or Firm*—Knobbe Martens Olson & Bear LLP

(57) ABSTRACT

A method of forming an ultra-thin SiN film includes: supplying a Si source gas into a reactor in which a substrate is placed on a susceptor; supplying an N source gas into the reactor at a flow rate which is at least 300 times that of the Si source gas; applying an RF power between an upper electrode and the susceptor in the reactor; and depositing an ultra-thin SiN film on the substrate.

13 Claims, 4 Drawing Sheets

METHOD OF FORMING ULTRA-THIN SIN FILM BY PLASMA CVD

CROSS-REFERENCE TO RELATED APPLICATIONS

This application claims the benefit of U.S. Provisional Application No. 60/865,784, filed Nov. 14, 2006, and the disclosure of which is herein incorporated by reference in its entirety.

BACKGROUND OF THE INVENTION

1. Field of the Invention

The present invention generally relates to a method of forming an ultra-thin SiN film by plasma CVD.

2. Description of the Related Art

SiN film is used widely in semiconductor processes as a gate insulation film, inter-layer wiring insulation film or surface protection film (passivation). Although SiN film is also expected to prevent diffusion of metal, etc., in the manufacturing of semiconductor devices using copper wires, the film thickness must be adjusted to an ultra-thin level of several nanometers (order of $10^{-9}$ m) in these applications in order to reduce the effective dielectric constant.

One traditional method that may be employed when an ultra-thin SiN film is used is to treat the surface of a SiO film using plasma containing nitrogen and thereby nitride the film surface (examples of this method are found in Japanese Patent Laid-open Nos. 2003-258257, 2003-188276 and 2002-009169). However, this method has the drawback of causing an increase in the number of steps. Also, under conventional methods to deposit a silicon nitride film the film deposition time needed to deposit a film of several nanometers in thickness becomes too short because the film deposition speed is too high. As a result, it is difficult to control the thickness of formed film by means of controlling the film deposition time.

SUMMARY OF THE INVENTION

Plasma CVD apparatuses use an impedance matching device to transmit RF power to the electrodes in the reaction chamber. However, if the matching device has an individual difference of approx. ±0.2 second in the time needed to achieve an impedance-matched state after the start of impression of RF power, then the actual film deposition time is subject to a variation of ±0.2 second due to the aforementioned individual difference of the matching device. Here, the band of chamber-to-chamber variation in the actual film deposition time exceeds 7% in processes where the film deposition time is shorter than 5.5 seconds, which is not practical in the operation at mass-production facilities. To form a film with a thickness in the order of $10^{-9}$ m, or 5 nm, for example, at a film deposition time of 5.5 seconds or longer, then the film deposition speed must be 55 nm/min or less. For your information, in an embodiment of the present invention "controlling the thickness of formed film" refers to controlling the variation in film thickness between chambers, and/or controlling the variation between wafers depending on the RF matching device (repeatability of matching speed), while in an embodiment the term refers to controlling the formation of film at a film deposition speed of 55 nm/min or less.

In an embodiment of the present invention, the thickness of formed film can be controlled easily at a level of several nanometers by simply controlling the film deposition time, which in turn is achieved by forming a silicon nitride film at a sufficiently slow film deposition speed. To markedly decrease the film deposition speed can be realized by increasing the flow rate of N gas significantly over the flow rate of Si gas, and/or decreasing the flow rate of Si gas significantly. This can not only improve the controllability of film formation, but it can also improve the uniformity of in-plane film thickness. Also, an embodiment of the present invention can reduce the number of steps, as compared to the method where the surface of a SiO film is nitrided, by forming an ultra-thin nitride film.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

DETAILED DESCRIPTION OF THE PREFERRED EMBODIMENT

Figure 1:
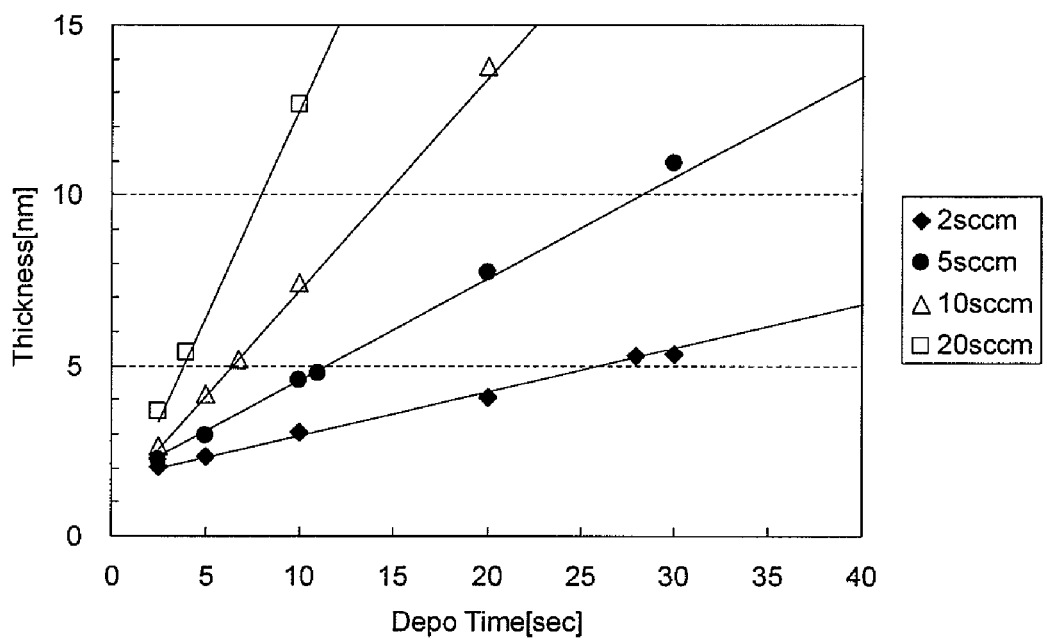
FIG. 1 is a graph showing the relationship of film deposition time and thickness of formed film.

The present invention will be explained in detail with reference to preferred embodiments. However, the preferred embodiments are not intended to limit the present invention.

In an embodiment of the present invention, when a SiN film is formed by the PECVD method using $SiH_4$ and $N_2$ as source gases, good controllability of film thickness and in-plane film thickness uniformity can be achieved simultaneously by [1] setting the feed rate of one source gas, such as $SiH_4$, to a level at which the equivalent volume in standard condition of the amount of gas supplied to the chamber per minute corresponds to, for example, 1.5% of the volume of the reaction space (such as approx. 652 $cm^3$) or less (such as approx. 10 sccm or less), and/or [2] setting the flow rate of another source gas that also serves as a dilution gas, such as $N_2$, to, for example, equal to or greater than 300 times the flow rate of $SiH_4$. Here, in an embodiment the volume of the reaction space represents the space directly above the wafer between the wafer and the upper electrode, where the specific volume is calculated by the formula "Wafer area×Distance between upper electrode and wafer" (for example, the volume becomes 652 cm³ (15.0×15.0×π×0.92) when the wafer size is 300 mm and the distance between the upper electrode and the wafer is 9.2 mm). In the above example, the distance between the two electrodes is 10 mm. The distance between the upper electrode and the wafer becomes 9.2 mm because when a wafer with a thickness of 0.75 mm to 0.8 mm is placed on the lower electrode, the distance between the upper electrode and the wafer is calculated as "10 mm (distance between electrodes)−0.8 mm (wafer thickness)=9.2 mm." It should be noted, however, that the present invention is not limited to this calculation example in any way.

In an embodiment, the present invention provides a method of forming an ultra-thin SiN film comprising the steps of: (i) supplying a Si source gas into a reactor in which a substrate is placed on a susceptor; (ii) supplying an N source gas into the reactor at a flow rate which is at least 300 times (including 500 times, 1,000 times, 2,000 times, 5,000 times, and any number between any of the foregoing) that of the Si source gas; (iii) applying an RF power between an upper electrode and the susceptor in the reactor; and (iv) depositing an ultra-thin SiN film on the substrate.

The above embodiment includes, but is not limited to, the following embodiments:

In an embodiment, the step of supplying the Si source gas may comprise controlling a flow rate of the Si source gas at a standard cubic centimeters per minute (sccm) which is 1.5% or less (including 1.25%, 1.0%, 0.75%, 0.5%, 0.25%, 0.1%, and any number between any of the foregoing) of a reaction space defined to be a product of a surface area of the substrate and an average distance between the upper electrode and the substrate. In another embodiment, the flow rate of the Si source gas may be more than 1.5% (including 1.75%, 2.0%, and any number between any of the foregoing), depending upon the ratio of the flow of the N source gas to the flow of the Si source gas, for example.

In an embodiment, the flow rate of the Si source gas may be 10 sccm or less (including 9 sccm, 7 sccm, 5 sccm, 3 sccm, 1 sccm, and any number between any of the foregoing). In another embodiment, the flow rate of the Si source gas may be more than 10 sccm (including 12 sccm, 15 sccm, 17 sccm, 20 sccm, and any number between any of the foregoing), depending upon the ratio of the flow of the N source gas to the flow of the Si source gas, for example.

In an embodiment, the step of depositing the ultra-thin SiN film may comprise controlling a deposition rate of the film at 55 nm/min or less (including 40 nm/min, 30 nm/min, 20 nm/min, 10 nm/min, 5 nm/min, and any number between any of the foregoing) by controlling the step of supplying the Si source gas and the step of supplying the N source gas. In another embodiment, the deposition rate of the film may be more than 55 nm/min (including 57 nm/min, 60 nm/min, 65 nm/min, and any number between any of the foregoing), depending upon the RF matching speed, etc.

In an embodiment, the Si source gas may be $SiH_4$, $Si_2H_6$, or $Si_3H_8$, for example. The N source gas may be $N_2$, for example. In an embodiment, an inactive gas may be added. For example, a mixture gas of $N_2$ and He or a mixture gas of $N_2$ and Ar may be used. The flow of inactive gas may be less than that of $N_2$ in an embodiment, or no less than $N_2$ in another embodiment. In an embodiment, the step of supplying the N source gas may further comprise supplying $NH_3$. The flow rate of $NH_3$ may be less than that of $N_2$ in an embodiment, or no less than $N_2$ in another embodiment. In an embodiment, the $NH_3$ may be supplied at a flow rate of 10 sccm or less.

In an embodiment, the step of depositing the ultra-thin SiN film may deposit the film at a thickness of less than 15 nm (including 12 nm, 10 nm, 8 nm, 6 nm, 4 nm, 2 nm, and any number between any of the foregoing).

In an embodiment, the ultra-thin SiN film obtained from the step of depositing the ultra-thin SiN film may have a uniformity of ±3% or less including ±2% or less. In an embodiment especially when the $NH_3$ is supplied, the ultra-thin SiN film obtained from the step of depositing the ultra-thin SiN film may have a leakage current of $10^{-6}$ A/cm² or less including $10^{-7}$ A/cm² or less at 2 MV/cm and/or a leakage current of $10^{-7}$ A/cm² or less including $10^{-8}$ A/cm² or less at 1 MV/cm.

In an embodiment, the present invention provides a method of forming an ultra-thin SiN film comprising the steps of: (i) supplying into a reactor in which a substrate is placed on a susceptor a Si source gas at a flow rate in standard cubic centimeters per minute (sccm) which is 1.5% or less (including 1.25%, 1.0%, 0.75%, 0.5%, 0.25%, 0.1%, and any number between any of the foregoing) of a reaction space defined to be a product of a surface area in centimeter of the substrate and an average distance in centimeter between an upper electrode and the substrate; (ii) supplying an N source gas into the reactor; (iii) applying an RF power between the upper electrode and the susceptor in the reactor; and (iv) depositing an ultra-thin SiN film on the substrate.

In an embodiment, the flow rate of the Si source gas may be 10 sccm or less (including 9 sccm, 7 sccm, 5 sccm, 3 sccm, 1 sccm, and any number between any of the foregoing). In an embodiment, the flow of the N source gas may be less than 300 times (including 275 times, 250 times, 200 times, and any number between any of the foregoing) that of the Si source gas, depending upon the flow rate of the Si source gas, for example.

In an embodiment, the SiN film may mean a film which is constituted mainly by Si—N bond but can contain impurities or other atoms.

In embodiments, the SiN film can be formed by PECVD under the following conditions:

|  | Typical Ranges | Preferred Ranges |
|---|---|---|
| Pressure (Torr) | 1.5-10.0 | 2.25-3.75 |
| Temperature (° C.) | 200-650 | 380-420 |
| High-Frequency RF Power (W) | 100-2,000 (1 MHz to 27.13 MHz) | 150-1,000 (13.56 MHz) |
| Low-frequency RF Power (W) | 0-1,000 (less than 1 MHz) | 0-350 (430 kHz) |
| Distance between Electrodes (mm) | 8-16 | 10-14 |

All of the aforesaid embodiments can be used separately or in any combination, unless explicit restrictions are imposed on particular embodiments.

In the present disclosure where conditions and/or structures are not specified, the skilled artisan in the art can readily provide such conditions and/or structures, in view of the present disclosure, as a matter of routine experimentation.

EXAMPLE 1

The best mode for carrying out the present invention is explained. It should be noted, however, that the present invention is not limited to the embodiments described below. In the examples, a SiN film was formed under the conditions shown in Table 1 using Eagle®-12 (ASM Japan K.K.) as a PECVD apparatus.

Also, in the present disclosure, the numerical numbers applied in embodiments can be modified by a range of at least ±50% in other embodiments, and the ranges applied in embodiments may include or exclude the endpoints.

TABLE 1

Film Forming Conditions

| SiH4 [sccm] | N2 [sccm] | Pressure [Torr] | RF [W] | Gap [mm] | Dep time [sec] |
|---|---|---|---|---|---|
| 2 | 5000 | 3.0 | 800 | 10 | 3~30 |
| 5 | 5000 | 3.0 | 800 | 10 | 3~30 |
| 10 | 5000 | 3.0 | 800 | 10 | 3~20 |
| 20 | 5000 | 3.0 | 800 | 10 | 3~10 |

FIG. 1 shows the effect the flow rate of $SiH_4$ has on the relationship of deposition time of SiN film and thickness of formed film. As shown in FIG. 1, under the conditions shown in Table 1 the thickness of formed film can be controlled by adjusting the film deposition time. Here, the film thickness per unit time increases as the flow rate of $SiH_4$ increases. In other words, the film thickness becomes more vulnerable to a slight variation in film deposition time (this is a variation between apparatuses and between wafers and does not indicate uniformity of in-plane film thickness). Based on the experience of the inventors, etc., controllability of film thickness is deemed "Good" when the film deposition speed is 55 nm/min at a film thickness of 5 nm.

Table 2 shows the film deposition speeds when 5 nm of film is formed, as calculated from the above results. As shown, in a $SiH_4$ flow rate range of 10 sccm or less the thickness of formed film can be controlled easily by simply adjusting the film deposition time. To be specific, the film deposition speed when 5 nm of film is formed is 48.1 nm/min or less at a $SiH_4$ flow rate of 10 sccm or less. All results in this flow rate range are less than 55 nm/min.

TABLE 2

Film Deposition Speed

| SiH4 [sccm] | Film deposition speed when 5 nm of film is formed [nm/min] | Controllability of film thickness in 5-nm range |
|---|---|---|
| 2 | 11.3 | Good |
| 5 | 26.2 | Good |
| 10 | 48.1 | Good |
| 20 | 80.9 | Bad |

Figure 2:
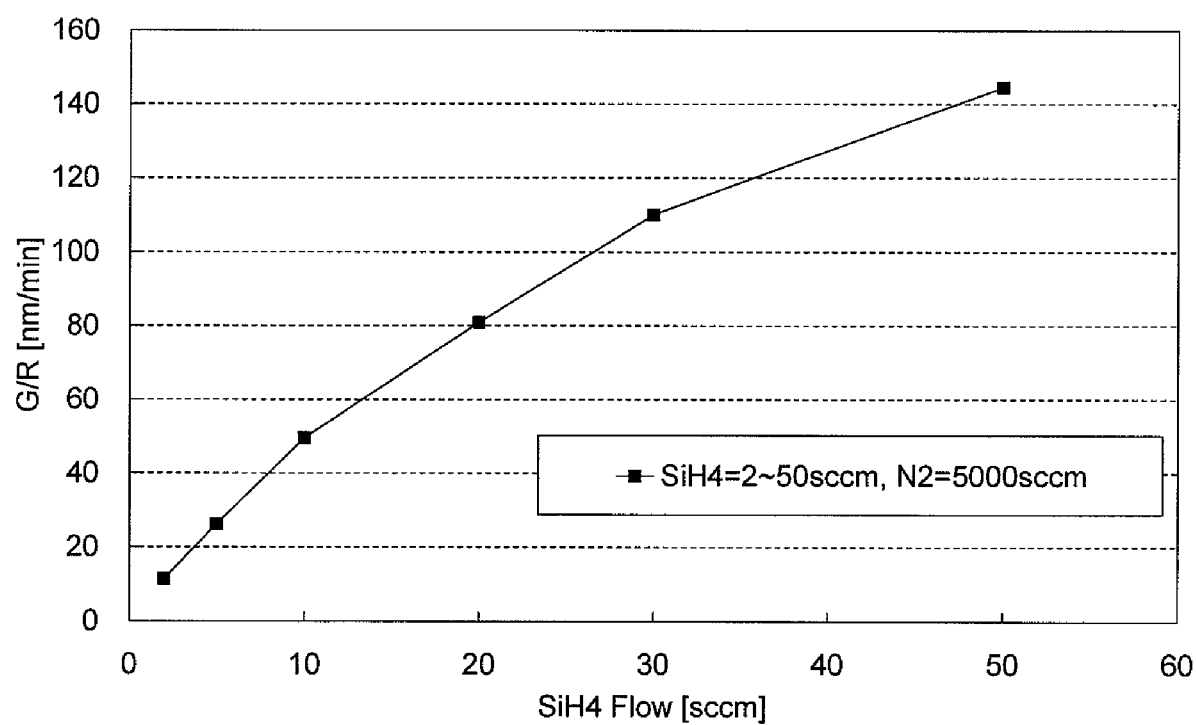
FIG. 2 is a graph showing the relationship of $SiH_4$ flow rate and film deposition speed when 5 nm of film is formed.

Under the $SiH_4$ flow rate conditions of 10 sccm or less as shown in Table 1, the film deposition time needed to form 5 nm of film is approx. 6 to 27 seconds, indicating sufficient controllability of film thickness. Also, the in-plane film thickness uniformity is less than ±3% under all conditions shown in Table 1, which is desirable. When the $SiH_4$ flow rate is set to 20 sccm, however, the film deposition speed exceeds 55 nm/min when 5 nm of film is formed. This reduces the film deposition time needed to form a 5-nm film to approx. 3.7 seconds, resulting in insufficient controllability of film thickness. FIG. 2 shows the relationship of $SiH_4$ flow rate and film deposition speed when 5 nm of film is formed.

Figure 3:
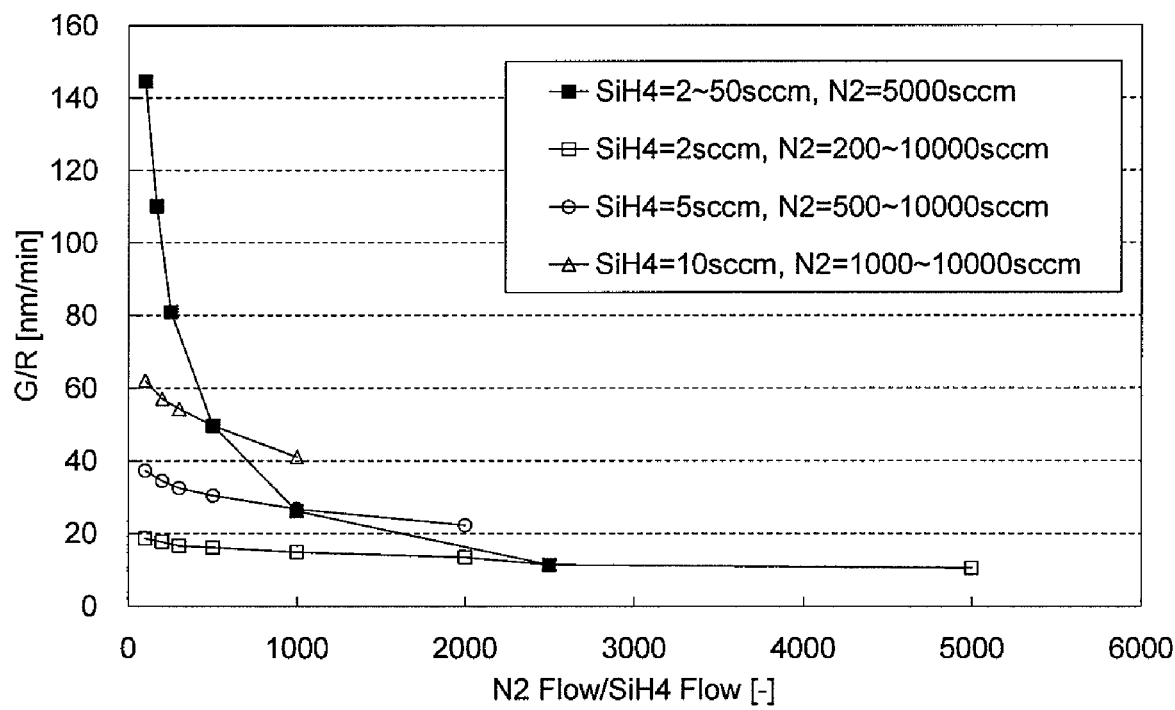
FIG. 3 is a graph showing the relationship of ratio of $N_2$ flow rate to $SiH_4$ flow rate and film deposition speed.

FIG. 3 shows the relationship of ratio of $N_2$ flow rate to $SiH_4$ flow rate and film deposition speed. When film is formed at $SiH_4$ flow rates of 2 sccm, 5 sccm and 10 sccm, respectively, by changing the ratio of $N_2$ flow rate, the film deposition speed becomes 55 nm/min or less at $SiH_4$ flow rates of 2 sccm and 5 sccm regardless of the $N_2$ flow rate. At a $SiH_4$ flow rate of 10 sccm, however, the ratio of $N_2$ flow rate needs to be 300 times the $SiH_4$ flow rate or more in order to keep the film deposition speed at 55 nm/min or less and thereby achieve sufficient controllability of film thickness.

Figure 4:
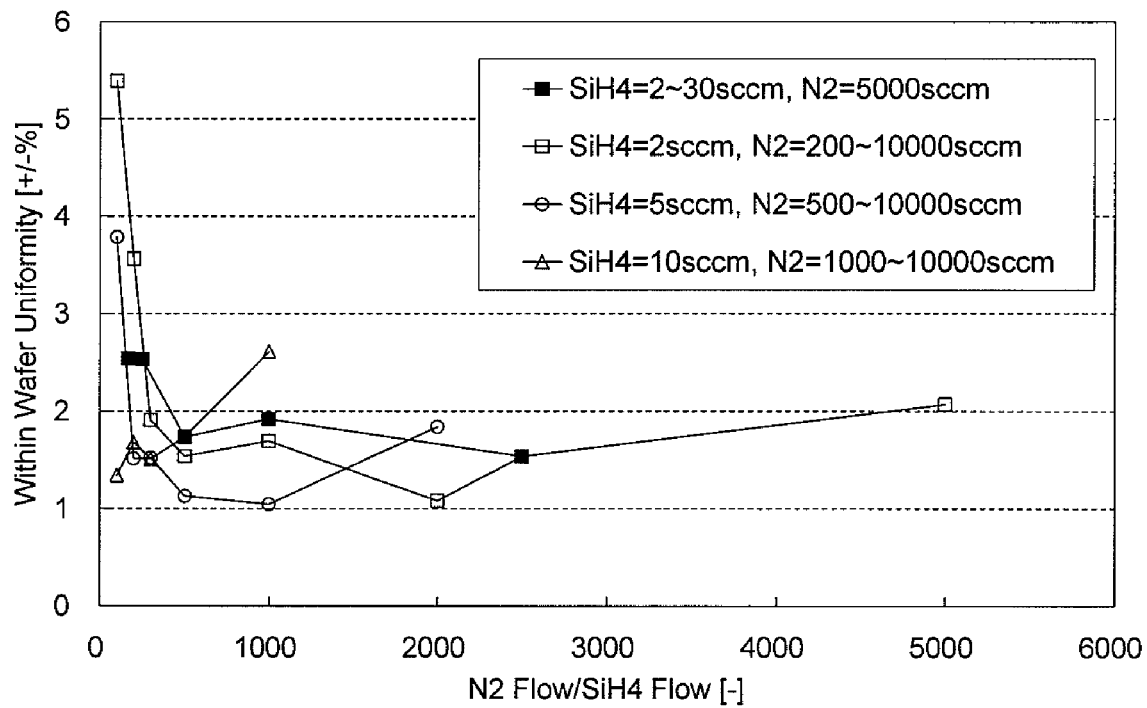
FIG. 4 is a graph showing the relationship of ratio of $N_2$ flow rate to $SiH_4$ flow rate and uniformity of in-plane film thickness.

FIG. 4 shows the relationship of ratio of $N_2$ flow rate to $SiH_4$ flow rate and uniformity of in-plane film thickness. While a good in-plane film thickness uniformity of 3% or less is achieved at a $SiH_4$ flow rate of 10 sccm regardless of the $N_2$ flow rate (although the film deposition speed exceeds 55 nm/min and consequently sufficient controllability of film thickness cannot be achieved unless the ratio of $N_2$ flow rate is 300 times the $SiH_4$ flow rate or more at a $SiH_4$ flow rate of 10 sccm, as explained above), the in-plane film thickness uniformity exceeds 3% in a range where the $N_2$ flow rate is less than 300 times the $SiH_4$ flow rate at a $SiH_4$ flow rate of 2 sccm or 5 sccm. In a range where the $N_2$ flow rate is equal to or greater than 300 times the $SiH_4$ flow rate at a $SiH_4$ flow rate of 2 sccm or 5 sccm, a good in-plane film thickness uniformity of less than 3% can be achieved under all conditions.

Based on the above, a film deposition speed of 55 nm/min or less and an in-plane film thickness uniformity of 3% or less can be achieved simultaneously by setting the $N_2$ flow rate to 300 times the $SiH_4$ flow rate or more.

EXAMPLE 2

Figure 5:
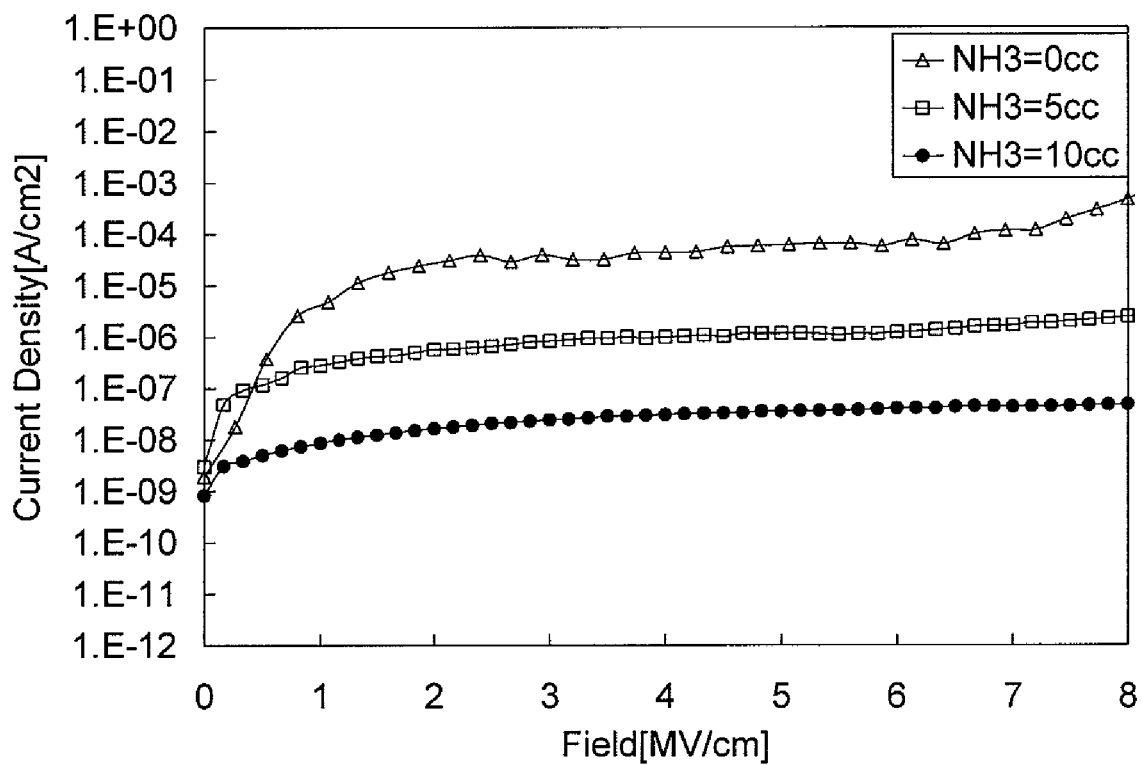
FIG. 5 is a graph showing the I-V characteristics when $NH_3$ is added to $N_2$.

To use a SiN film on a metal wiring layer, the leakage current that flows through the film needs to be kept to a minimum. Here, good controllability of film thickness can be maintained even when $NH_3$ is added to the film forming conditions mentioned in the best mode of embodiment to improve the leakage current characteristics (I-V characteristics) of the formed film. Table 3 below shows a variation example where the film forming conditions include $NH_3$ as an additive gas. The measured I-V characteristics are shown in FIG. 5 and Table 4.

TABLE 3

Film Forming Conditions

| SiH4 [sccm] | N2 [sccm] | NH3 [sccm] | Pressure [Torr] | RF [W] | Gap [mm] |
|---|---|---|---|---|---|
| 5 | 5000 | 0 | 3.0 | 800 | 10 |
| 5 | 5000 | 5 | 3.0 | 800 | 10 |
| 5 | 5000 | 10 | 3.0 | 800 | 10 |

When $NH_3$ is added to the SiN film forming process, the film deposition speed tends to increase slightly while leakage current decreases. Accordingly, addition of $NH_3$ is desirable as a way to improve leakage current. On the other hand, however, adding $NH_3$ increases the film deposition speed and thereby reduces the controllability of film thickness. The above general trends are also clear in this example. As evident from the measured I-V characteristics in FIG. 5 and Table 4, through addition of NH3 by 10 sccm the leakage current at an impressed electric field of 2 MV/cm can be reduced to as low as approx. 1/1670 of the leakage current that flows when NH$_3$ is not added.

TABLE 4

Measured I-V Characteristics

| NH3 [sccm] | Leakage current [A/cm$^2$] @ 1 MV/cm | Leakage current [A/cm$^2$] @ 2 MV/cm |
|---|---|---|
| 0 | 3.94E−06 | 2.70E−05 |
| 5 | 2.75E−07 | 5.66E−07 |
| 10 | 8.58E−09 | 1.62E−08 |

Figure 6:
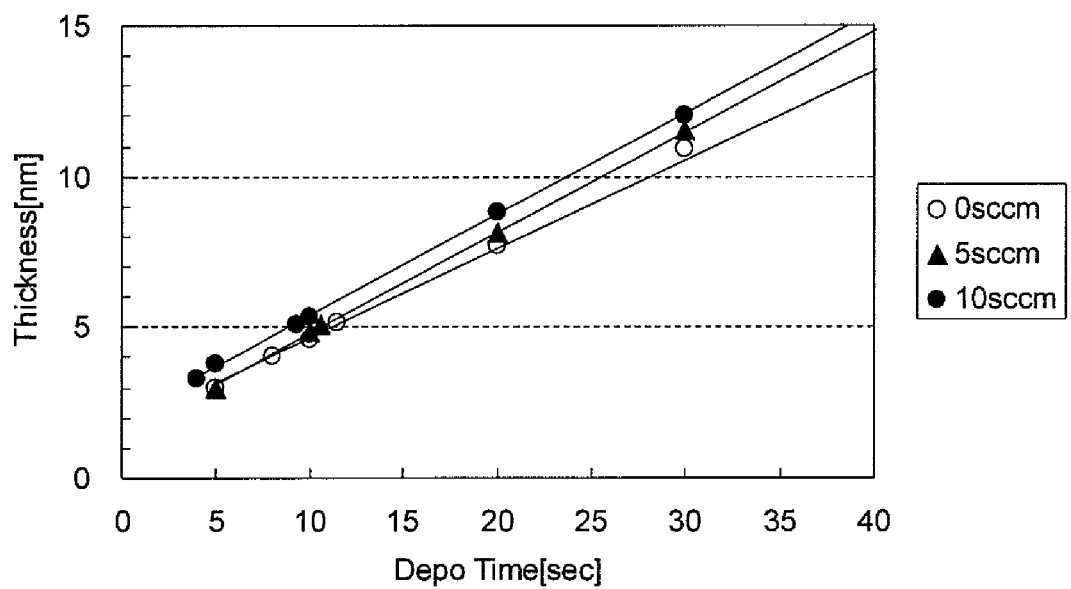
FIG. 6 is a graph showing the relationship of film deposition time and thickness of formed film when $NH_3$ is added to $N_2$.

In this example, however, the increase in film deposition speed is small compared to the improvement in leakage current (the same film deposition speed can be roughly maintained). As evident from the data on film deposition speed with NH$_3$ added, as shown in FIG. 6 and Table 5, leakage current can be improved significantly while maintaining good controllability of film thickness.

TABLE 5

Film Deposition Speed

| NH3 [sccm] | Film deposition speed when 5 nm of film is formed [nm/min] | Controllability of film thickness in 5-nm range |
|---|---|---|
| 0 | 26.2 | Good |
| 5 | 28.9 | Good |
| 10 | 34.6 | Good |

EXAMPLE 3

When a SiN film is used as a metal diffusion blocking layer, high blocking property of the film is required. Here, "blocking property" denotes a property of blocking permeation of metal or moisture through the film.

By adding low frequency RF power (430 kHz) to the film forming conditions used in Example 2, the blocking property of the forming film can be improved. Table 3 below shows film forming conditions.

TABLE 6

Film Forming Conditions

| SiH4 [sccm] | N2 [sccm] | NH3 [sccm] | Pressure [Torr] | HRF 13.56 MHz [W] | LRF 430 kHz [W] | Gap [mm] |
|---|---|---|---|---|---|---|
| 5 | 5000 | 10 | 3.0 | 800 | 0 | 10 |
| 5 | 5000 | 10 | 3.0 | 800 | 200 | 10 |

Figure 7:
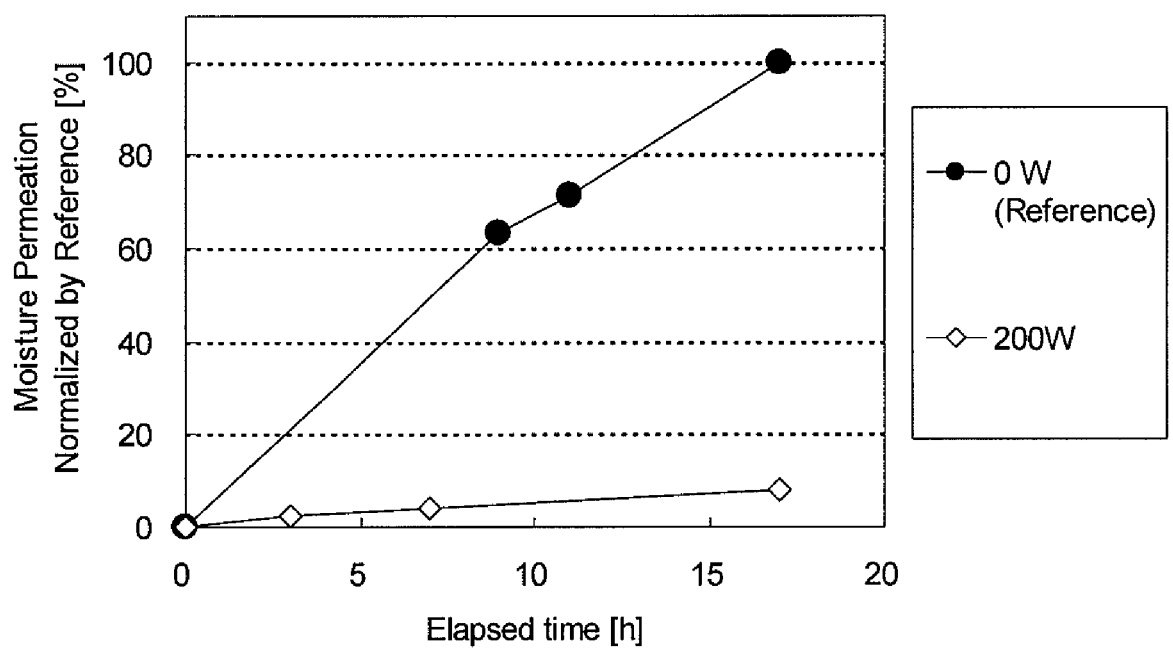
FIG. 7 is a graph showing the relationship of elapsed time (hours) and moisture permeation normalized by reference (%) when LRF power is added.

The method of evaluating the degree of moisture permeation through the SiN film was as follows: 1) A TEOS-based SiO film was formed on a silicone substrate by controlling the film forming conditions such that the film had high moisture absorption so as to change its film stress over time due to the absorption of moisture from the atmosphere, followed by laminating the SiN film on the SiO film, and immediately thereafter, film stress was measured. 2) After keeping the film in the atmosphere for a given time period, film stress was measured again, thereby measuring changes of film stress. The higher the blocking property of the SiN film used as a cap film, the more the permeation of moisture from the atmosphere through the SiN film into the underlying SiO film can be blocked, and the more the alleviation of film stress changes over time can be achieved. Thus, by comparing the film stress changes over time, the degree of absorption of moisture by the SiO film, i.e., the degree of permeation of moisture through the SiN film can be evaluated. In this case, the thickness of the SiO film was 500 nm, the thickness of the SiN film formed thereon was 5 nm, and the degree of moisture permeation through the SiN film was evaluated according to the above method. FIG. 7 and Table 7 show the degree of moisture permeation of each film as measured when the degree of moisture permeation 17 hours after the film formation of the SiN film without using the LRF power was 100%. As can be seen, by adding 200 W of the LRF power to the film forming conditions for the SiN film, the degree of moisture permeation is reduced to less than 1/10 of that of the case without the LRF power.

TABLE 7

Degree of Moisture Permeation

| LRF [W] | Moisture Permeation |
|---|---|
| 0 | 100% |
| 200 | 8% |

Figure 8:
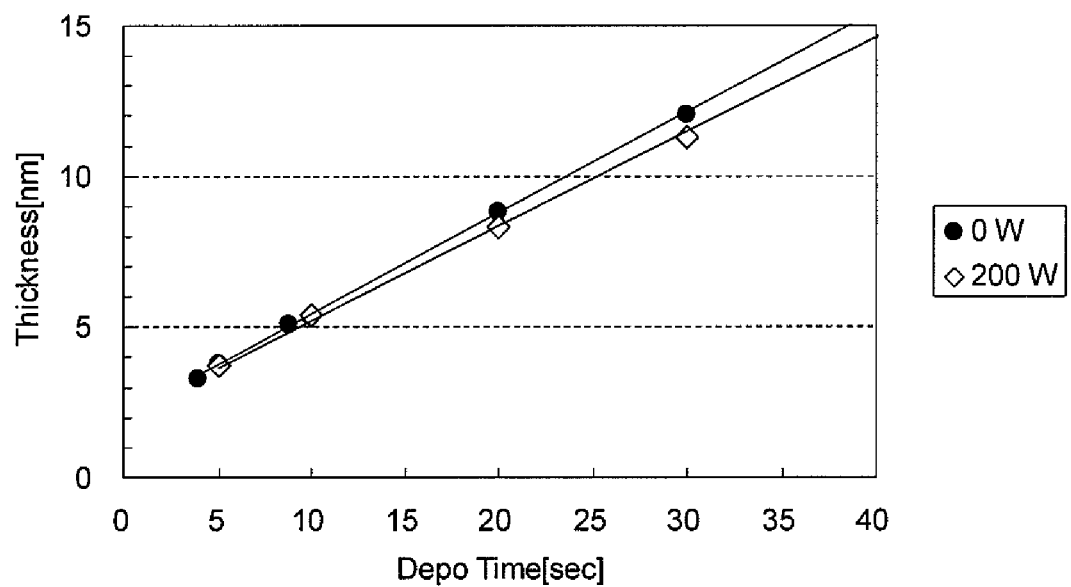
FIG. 8 is a graph showing the relationship of film deposition time and thickness of formed film when LRF power is added.

As shown in FIG. 7 and Table 7, also in the case where the blocking property is improved by adding the LRF power, as shown in FIG. 8 and Table 8, the film deposition speed is sufficiently low and good controllability of film thickness can be maintained.

TABLE 8

Film Deposition Speed

| LRF [W] | Film deposition speed when 5 nm of film is formed [nm/min] | Controllability of film thickness in 5-nm range |
|---|---|---|
| 0 | 34.6 | Good |
| 200 | 32.4 | Good |

As explained above, in an embodiment of the present invention an ultra-thin SiN film offering good controllability of film thickness and in-plane film thickness uniformity can be formed by setting the feed rate of a source gas SiH$_4$ to a level at which the equivalent volume in standard condition of the amount of gas supplied to the reaction chamber per minute corresponds to, for example, 1.5% of the volume of the reaction space (such as approx. 652 cm$^3$) or less (such as approx. 10 sccm or less), and/or setting the flow rate of another source gas N$_2$ that also serves as a dilution gas to, for example, equal to or greater than 300 times the flow rate of SiH$_4$.

In another embodiment, I-V characteristics can be improved by adding NH$_3$, without reducing the controllability of film thickness.

In another embodiment, moisture blocking property can be improved by adding LRF, without reducing the controllability of film thickness.

In yet another embodiment, the resulting SiN film can be used widely in semiconductor processes as a gate insulation film, inter-layer wiring insulation film or surface protection film (passivation).

It will be understood by those skilled in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming an ultra-thin SiN film comprising the steps of:
    supplying a Si source gas into a reactor in which a substrate is placed on a susceptor, wherein the flow rate of the Si source gas is 10 sccm or less;
    supplying an N source gas into the reactor at a flow rate which is over 1,000 times that of the Si source gas;
    applying an RF power between an upper electrode and the susceptor in the reactor; and
    depositing an ultra-thin SiN film on the substrate, wherein the step of depositing the ultra-thin SiN film comprises controlling a deposition rate of the film at 55 nm/min or less by controlling the step of supplying the Si source gas and the step of supplying the N source gas.

2. The method according to claim 1, wherein the Si source gas is $SiH_4$.

3. The method according to claim 1, wherein the N source gas is $N_2$.

4. The method according to claim 1, wherein the step of depositing the ultra-thin SiN film deposits the film at a thickness of less than 15 nm.

5. The method according to claim 1, wherein the step of supplying the N source gas further comprises supplying $NH_3$.

6. The method according to claim 1, wherein the ultra-thin SiN film obtained from the step of depositing the ultra-thin SiN film has a uniformity of ±3% or less.

7. The method according to claim 1, wherein in the step of supplying the N source gas, the N source gas is supplied at a flow rate which is no less than 2,000 times that of the Si source gas.

8. The method according to claim 5, wherein the $NH_3$ is supplied at a flow rate of 10 sccm or less.

9. The method according to claim 8, wherein the ultra-thin SiN film obtained from the step of depositing the ultra-thin SiN film has a leakage current of $10^{-6}$ $A/cm^2$ or less at 2 MV/cm.

10. A method of forming an ultra-thin SiN film comprising the steps of:
    supplying a Si source gas into a reactor in which a substrate is placed on a susceptor, wherein the flow rate of the Si source gas is 10 sccm or less;
    supplying an N source gas into the reactor at a flow rate which is at least 300 times that of the Si source gas;
    applying an RF power between an upper electrode and the susceptor in the reactor; and
    depositing an ultra-thin SiN film on the substrate, wherein the step of depositing the ultra-thin SiN film comprises controlling a deposition rate of the film at 55 nm/min or less by controlling the step of supplying the Si source gas and the step of supplying the N source gas,
    wherein the RF power is a combination of high-frequency RF power of 1 MHz to 27.13 MHz and low-frequency RF power of less than 1 MHz.

11. The method according to claim 10, wherein the high-frequency RF power is applied at 150-1,000 W and the low-frequency RF power is applied at no more than 350 W.

12. The method according to claim 10, wherein in the step of supplying the N source gas, the N source gas is supplied at a flow rate which is over 1,000 times that of the Si source gas.

13. The method according to claim 12, wherein in the step of supplying the N source gas, the N source gas is supplied at a flow rate which is no less than 2,000 times that of the Si source gas.

* * * * *